US007633358B2

(12) United States Patent
Nakasha et al.

(10) Patent No.: US 7,633,358 B2
(45) Date of Patent: Dec. 15, 2009

(54) PHASE SHIFTER CIRCUIT WITH PROPER BROADBAND PERFORMANCE

(75) Inventors: Yasuhiro Nakasha, Kawasaki (JP); Tatsuya Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/606,989

(22) Filed: Dec. 1, 2006

(65) Prior Publication Data
US 2008/0012660 A1 Jan. 17, 2008

(30) Foreign Application Priority Data
Jul. 12, 2006 (JP) .............................. 2006-191874

(51) Int. Cl.
*H03H 7/18* (2006.01)
*H03H 7/20* (2006.01)
(52) U.S. Cl. ........................ 333/138; 333/168; 333/172
(58) Field of Classification Search ................. 333/138, 333/164, 172, 139, 140, 156, 161, 167
See application file for complete search history.

(56) References Cited

U.S. PATENT DOCUMENTS 5,736,840 A * 4/1998 Otaka et al. ................. 323/217

| 6,388,543 B1 * | 5/2002 | Molnar et al. ................ 333/172 |
| 6,529,100 B1 * | 3/2003 | Okanobu ..................... 333/172 |
| 6,690,243 B1 * | 2/2004 | Henrion ................... 331/117 R |
| 7,196,915 B2 * | 3/2007 | Savio et al. .................... 363/22 |
| 7,405,636 B2 * | 7/2008 | Ozasa et al. ................. 333/172 |

FOREIGN PATENT DOCUMENTS

JP          06-069753 A    3/1994

* cited by examiner

*Primary Examiner*—Dean O Takaoka
(74) *Attorney, Agent, or Firm*—Fujitsu Patent Center

(57) ABSTRACT

A phase shifter circuit includes a plurality of first series circuits each comprised of a series connection of one capacitor and one resistor, a first circuit element including at least inductance connecting between a first end and a second end of a chain structure made by connecting the plurality of first series circuits in series, the first circuit element and the chain structure together constituting a first loop circuit, a plurality of second series circuits each comprised of a series connection of one capacitor and one resistor, a second circuit element including at least inductance connecting between a first end and a second end of a chain structure made by connecting the plurality of second series circuits in series, the second circuit element and the chain structure together constituting a second loop circuit, and a plurality of connection lines connecting between the first loop circuit and the second loop circuit.

14 Claims, 18 Drawing Sheets

FIG.1A RELATED ART
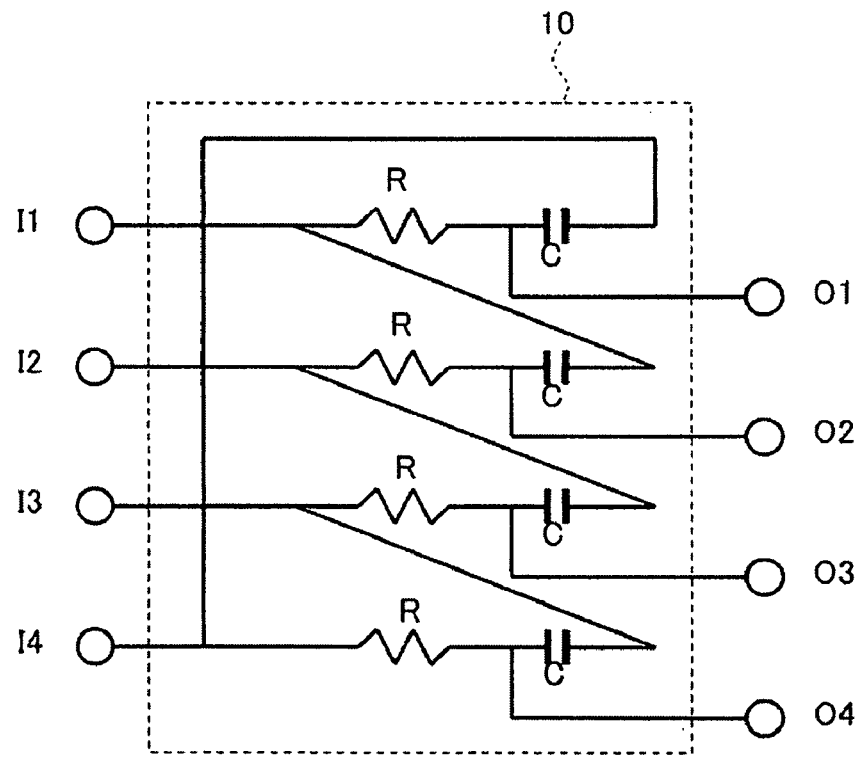
FIG.1B RELATED ART
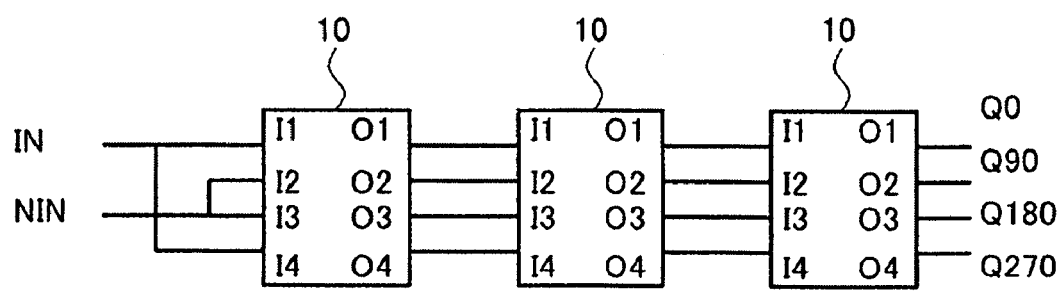

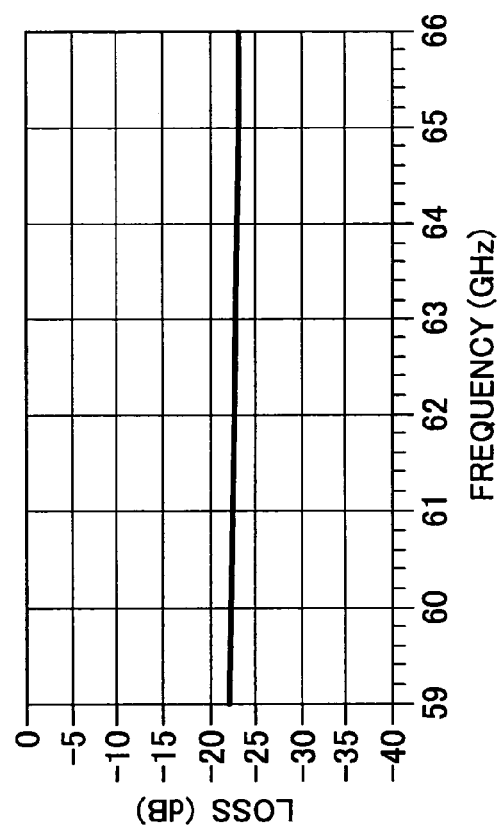
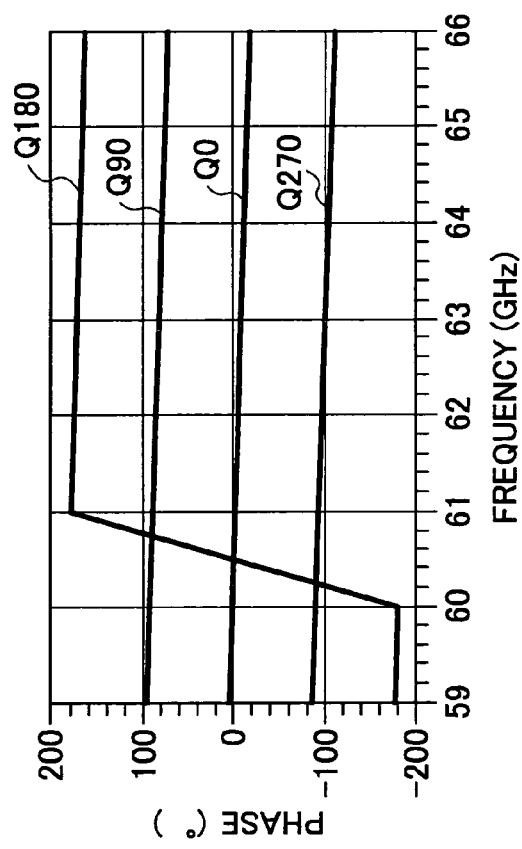
FIG.6B
FIG.6A

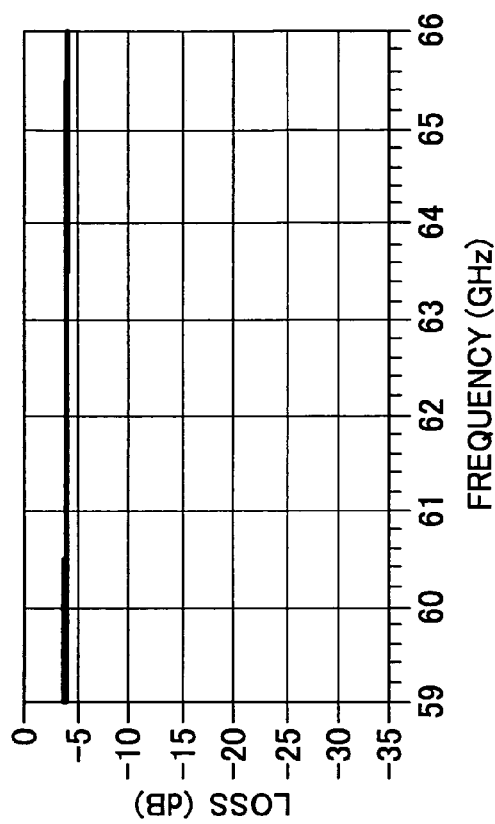
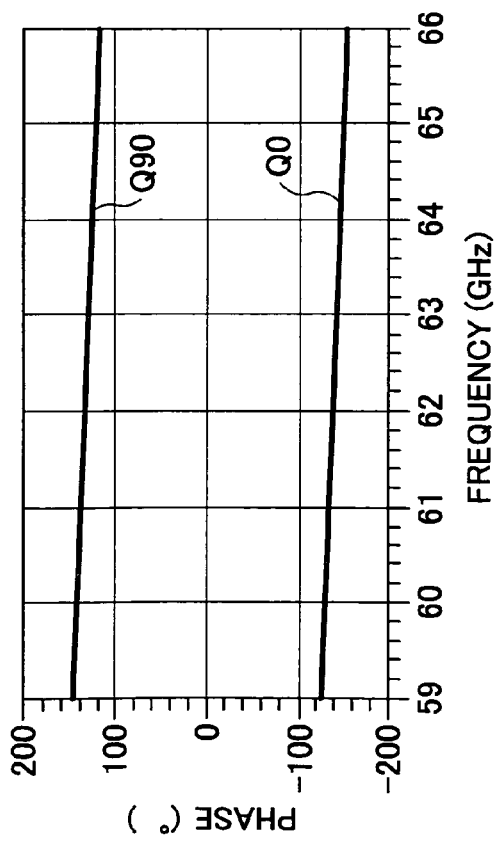
FIG.7A
FIG.7B

PHASE SHIFTER CIRCUIT WITH PROPER BROADBAND PERFORMANCE

CROSS-REFERENCE TO RELATED APPLICATIONS

The present application is based upon and claims the benefit of priority from the prior Japanese Patent Application No. 2006-191874 filed on Jul. 12, 2006, with the Japanese Patent Office, the entire contents of which are incorporated herein by reference.

BACKGROUND OF THE INVENTION

1. Field of the Invention

The present invention generally relates to circuits for converting the characteristics of a signal, and particularly relates to a phase shifter for changing the phase of a signal.

2. Description of the Related Art

Phase shifters for changing the phase of a signal are widely used as a component for a system such as a wired/wireless communication apparatus or measurement apparatus utilizing microwave bands or milliwave bands. In the orthogonal modulation which is widely used in the wireless communication system of today, for example, a 90-degree phase shifter is used as an indispensable component in order to generate an orthogonal signal having a 90-degree phase displacement. A variable phase shifter that is capable of changing the amount of phase shift is used for various purposes such as for the phased array operation that controls the direction of transmission by supplying signals having different phases to a plurality of antenna transmitters, for the spatial synthesis operation that synthesizes in the same phase a plurality of signals received by a plurality of antennas, or for the accuracy maintaining function that electrically adjusts phases inside measurement apparatus.

Performance required of such phase shifters conventionally includes high precision, low loss, controllability, low cost, etc. As progress toward the use of higher frequencies and broader bands has been made in wireless systems in recent years, there is also a demand for increased bandwidths. As a 90-degree phase shifter required in the orthogonal modulation/demodulation system, a polyphase filter or hybrid coupler has conventionally been used.

FIGS. 1A and 1B are drawings showing a typical configuration of a polyphase filter. A polyphase filter 10 shown in FIG. 1A includes four resistors R and four capacitors C. A series connection of one resistor R and one capacitor C forms one series circuit, and four series circuits are connected in series, with the head end and the tail end being coupled to form a loop. Input terminals I1 through I4 are coupled to the connection points between every two adjacent series circuits, and output terminals O1 through O4 are coupled to the connection points between the resistor R and the capacitor C of each series circuit.

A positive-phase signal (i.e., signal having a 0-degree phase) is supplied to the input terminals I1 and I4, for example, and a negative-phase signal (i.e., signal having a 180-degree phase) is supplied to the input terminals I2 and I3. With the input signals supplied in this manner, signals having a 0-degree phase, a 90-degree phase, a 180-degree phase, and a 270-degree phase appear at the output terminals O1 through O4, respectively. Polyphase filters 10 having the same configuration as shown in FIG. 1A may be connected in cascade with the output of a given filter connected to the input of a next filter as shown in FIG. 1B. Such configuration can generate the individual phase signals in a relatively stable manner over a broad band of frequencies.

FIG. 2 is a drawing showing a typical configuration of a hybrid coupler. A hybrid coupler 11 shown in FIG. 2 is implemented by connecting transmission lines 12, 13, 14, and 15 in series to form a loop. The transmission lines 12 and 13 have a characteristic impedance of Z0, and have a length that is equal to ¼ of signal wavelength λ. The transmission lines 14 and 15 have a characteristic impedance of 0.707×Z0 (i.e., $Z0/\sqrt{2}$), and have a length that is equal to ¼ of signal wavelength λ. With an input terminal IN positioned between the transmission line 12 and the transmission line 14, for example, two signals Q0 and Q90 having a 90-degree phase difference appear at the opposite ends of the transmission line 13.

In the case of the polyphase filter as shown in FIG. 1, three to five units need to be connected in cascade in order to obtain a 90-degree phase difference over a broad band of frequencies. This results in increased circuit size. An increase in circuit size means an increase in the time required for signal propagation inside the filter, which gives rise to a problem in that a phase deviation (i.e., absolute phase deviation responsive to frequency) within the band increases. There are also an increase in loss and cost increase. In the case of the hybrid coupler shown in FIG. 2, the loss is relatively small, but this coupler is not suitable for broadband operations because of the use of ¼ wavelength transmission lines. Phase deviation (i.e., absolute phase deviation responsive to frequency) within the band is larger than in the case of the polyphase filter.

In this manner, related-art 90-degree phase shifters have a problem of poor broadband performance, i.e., a problem of a large phase deviation within the band.

Accordingly, there is a need for a phase shifter that has a small phase deviation over a broad band of frequencies.

[Patent Document 1] Japanese Patent Application Publication No. 6-69753

SUMMARY OF THE INVENTION

It is a general object of the present invention to provide a phase shifter circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a phase shifter circuit particularly pointed out in the specification in such full, clear, concise, and exact terms as to enable a person having ordinary skill in the art to practice the invention.

To achieve these and other advantages in accordance with the purpose of the invention, the invention provides a phase shifter circuit, which includes a plurality of first series circuits each comprised of a series connection of one capacitor and one resistor, a first circuit element including at least inductance connecting between a first end and a second end of a chain structure made by connecting the plurality of first series circuits in series, the first circuit element and the chain structure together constituting a first loop circuit, a plurality of second series circuits each comprised of a series connection of one capacitor and one resistor, a second circuit element including at least inductance connecting between a first end and a second end of a chain structure made by connecting the plurality of second series circuits in series, the second circuit element and the chain structure together constituting a second loop circuit, a plurality of connection lines connecting between the first loop circuit and the second loop circuit, a signal input terminal connected to a node in the first loop circuit, and a signal output terminal connected to a node in the second loop circuit.

According to at least one embodiment of the present invention, a phase shifter circuit is provided that is superior in terms of broadband performance, i.e., has a smaller phase deviation over the intended frequency band, compared with related-art circuits.

BRIEF DESCRIPTION OF THE DRAWINGS

Other objects and further features of the present invention will be apparent from the following detailed description when read in conjunction with the accompanying drawings, in which:

FIGS. 1A and 1B are drawings showing a typical configuration of a polyphase filter;

FIGS. 6A and 6B are drawings showing an example of the operation characteristics of a polyphase filter for the purpose of comparison with the present invention;

FIGS. 7A and 7B are drawings showing an example of the operation characteristics of a hybrid coupler for the purpose of comparison with the present invention;

DESCRIPTION OF THE PREFERRED EMBODIMENTS

In the following, embodiments of the present invention will be described with reference to the accompanying drawings.

Figure 3A:
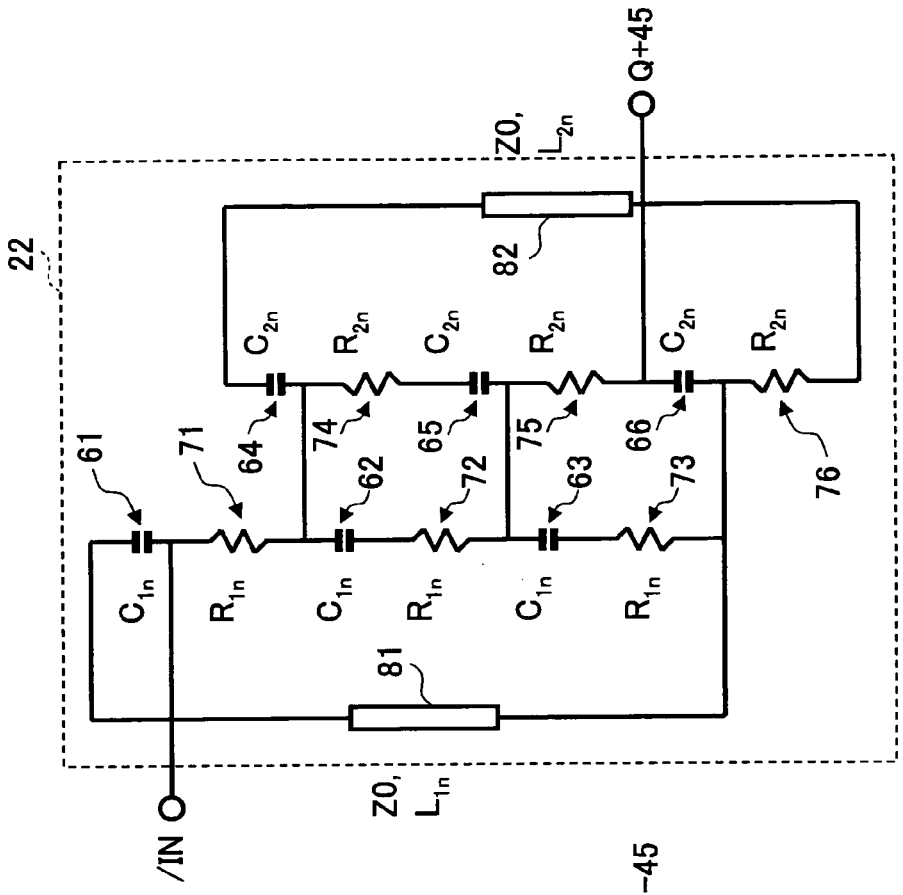
FIGS. 3A and 3B are drawings showing an example of the circuit configuration of a 90-degree phase shifter according to the present invention.
Figure 3B:
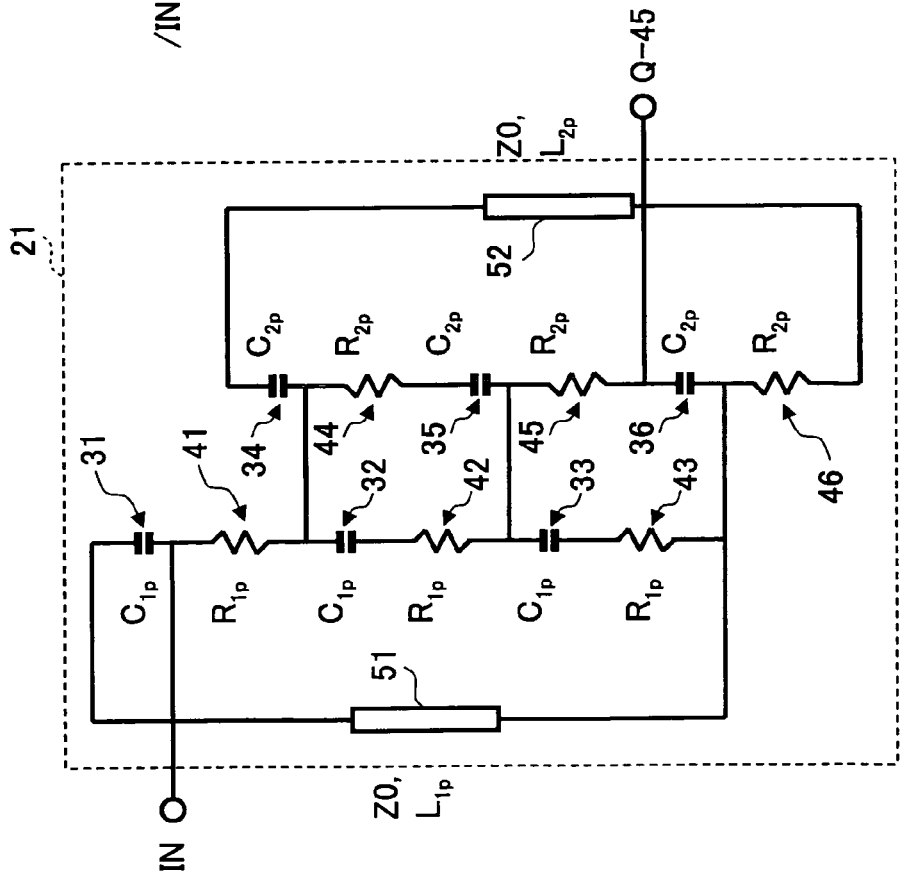

FIGS. 3A and 3B are drawings showing an example of the circuit configuration of a 90-degree phase shifter according to the present invention. The 90-degree phase shifter of the present invention includes a −45 degree phase shifter 21 configured to receive a positive-phase signal IN of differential input signals as an input thereof to delay its phase by 45 degrees and a +45 degree phase shifter 22 configured to receive a negative-phase signal /IN as an input thereof to advance its phase by 45 degrees. An output signal Q−45 having a 45-degree phase delay generated by the −45 degree phase shifter 21 and an output signal Q+45 having a 45-degree phase advance generated by the +45 degree phase shifter 22 are different in phase by 90 degrees. In this manner, signals having a 90-degree phase difference are generated.

The −45 degree phase shifter 21 shown in FIG. 3A and the +45 degree phase shifter 22 shown in FIG. 3B have the same circuit configuration, except for differences in the circuit parameters. Each of the −45 degree phase shifter 21 and the +45 degree phase shifter 22 is a novel phase shifter according to the present invention, and has a different configuration than the related-art phase shifters.

As shown in FIG. 3A, the −45 degree phase shifter 21 includes capacitors 31 through 36, resistors 41 through 46, and transmission lines 51 and 52. As shown in FIG. 3B, the +45 degree phase shifter 22 includes capacitors 61 through 66, resistors 71 through 76, and transmission lines 81 and 82. In the following, the configuration and operation of the −45 degree phase shifter 21 will be described. What will be described also applies to the +45 degree phase shifter 22.

In the −45 degree phase shifter 21, one of the capacitors 31 through 36 and a corresponding one of the resistors 41 through 46 together constitute a series circuit comprised of a series connection of one capacitor and one resistor. Three such series circuits are connected in series to form a chain, and the head end and tail end of the chain are coupled via the transmission line 51 to form a first loop circuit. Three series circuits each comprised of a series connection of one capacitor and one resistor are connected in series to form a chain, and the head end and tail end of this chain are coupled via the transmission line 52 to form a second loop circuit. In an example shown in FIG. 3A, it is preferable to provide three series circuits in each of the first loop circuit and the second loop circuit. The number of the series circuits, however, is not limited to three. If the loss of the output signal is small, any number of series circuits may be provided As will later be described, the transmission lines 51 and 52 may alternatively be inductors. The transmission lines 51 and 52 may be implemented as microstrip lines, for example.

Each of the three series circuits (i.e., a first series circuit 31 and 41, a second series circuit 32 and 42, and a third series circuit 33 and 43) included in the first loop circuit has one end thereof on the same side serving as a connection point to the second loop circuit. Each of the three series circuits (i.e., a first series circuit 34 and 44, a second series circuit 35 and 45, and a third series circuit 36 and 46) included in the second loop circuit has a connection point between the capacitor and the resistor thereof serving as a connection point to the first loop circuit. The connection points of the first loop circuit are connected in one-to-one correspondence to the connection points of the second loop circuits according to the order of their spatial arrangement.

An input terminal IN is connected to the connection point between the capacitor and the resistor of one of the series circuits included in the first loop circuit. An output terminal Q−45 is connected to the connection point between two adjacent series circuits included in the second loop circuit.

In the first loop circuit, the capacitors 31 through 33 have the same capacitance $C_{1p}$, and the resistors 41 through 43 have the same resistance $R_{1p}$. In the second loop circuit, the capacitors 34 through 36 have the same capacitance $C_{2p}$, and the resistors 44 through 46 have the same resistance $R_{2p}$. The transmission line 51 has a characteristic impedance Z0 and a line length $L_{1p}$, and the transmission line 52 has a characteristic impedance Z0 and a line length $L_{2p}$. The capacitance $C_{1p}$ and the capacitance $C_{2p}$ are different from each other, and the resistance $R_{1p}$ and the resistance $R_{2p}$ are different from each other. Further, the line length $L_{1p}$ and the line length $L_{2p}$ are different from each other. The characteristic impedance are the same between the transmission lines 51 and 52.

The adjustment of the capacitances, resistances, line lengths, and characteristic impedance makes it possible to control the amount of phase deviation. These parameters are set to different values between the −45 degree phase shifter 21 shown in FIG. 3A and the +45 degree phase shifter 22 shown in FIG. 3B, thereby achieving a −45 degree phase shift in one of the phase sifters and a +45 degree phase shift in the other one of the phase shifters. Namely, when a sinusoidal wave is input into the input terminal IN of the −45 degree phase shifter 21, a sinusoidal wave having a 45-degree phase delay relative to the input sinusoidal wave is output from the output terminal Q−45. Further, when a sinusoidal wave having a predetermined phase is input into the input terminal /IN of the +45 degree phase shifter 22, a sinusoidal wave having a 45-degree phase advance relative to the input sinusoidal wave is output from the output terminal Q+45.

Figure 4A:
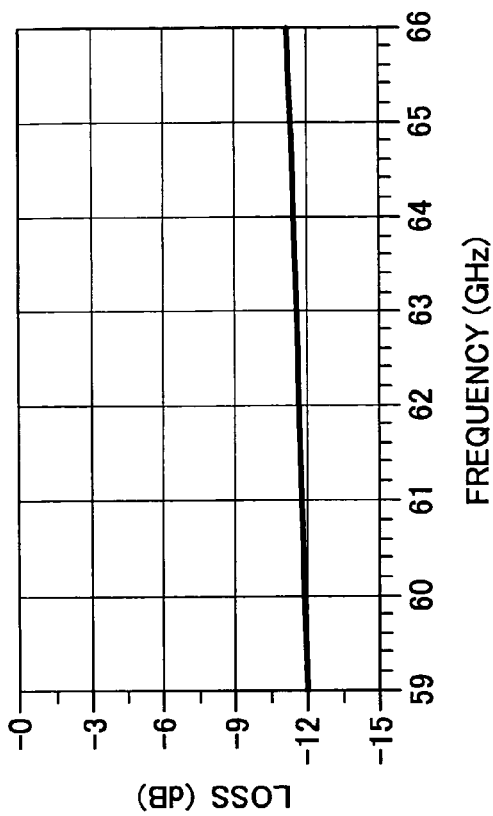
FIGS. 4A and 4B are drawings showing an example of the operation characteristics of the −45 degree phase shifter.
Figure 4B:
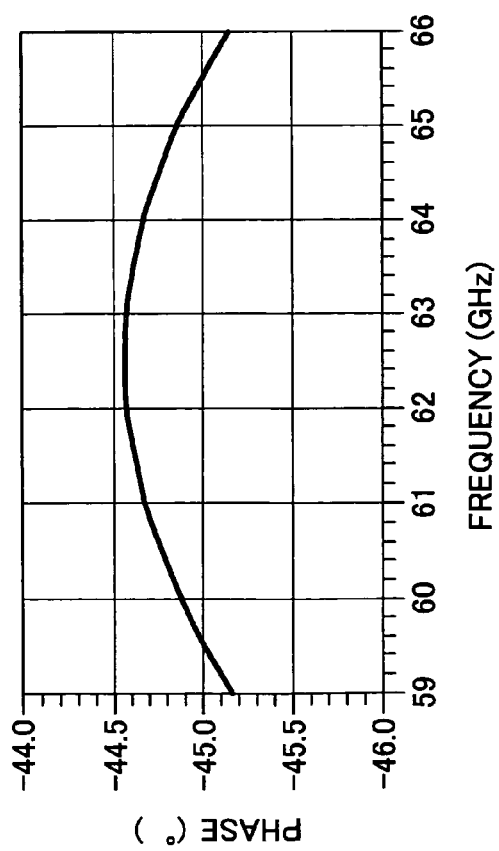

FIGS. 4A and 4B are drawings showing an example of the operation characteristics of the −45 degree phase shifter 21. FIG. 4A shows frequency along the horizontal axis and phase along the vertical axis, and illustrates phase deviation responsive to changes in frequency. FIG. 4B shows frequency along the horizontal axis and loss (decibel) along the vertical axis, and illustrates changes in loss responsive to changes in frequency. In the −45 degree phase shifter 21 shown in FIGS. 4A and 4B, the capacitance $C_{1p}$ of the capacitors 31 through 33 is 640 fF, the resistance $R_{1p}$ of the resistors 41 through 43 being 25 Ω, the characteristic impedance Z0 of the transmission line 51 being 50 Ω, the line length $L_{1p}$ of the transmission line 51 being 500 μm, the capacitance $C_{2p}$ of the capacitors 34 through 36 being 220 fF, the resistance $R_{2p}$ of the resistors 44 through 46 being 40 Ω, the characteristic impedance Z0 of the transmission line 52 being 50 Ω, and the line length $L_{2p}$ of the transmission line 52 being 1600 μm.

With the parameter settings as specified above, the phase of the output of the −45 degree phase shifter 21 is maintained substantially at −45 degrees as shown in FIG. 4A, and exhibits a phase deviation as small as about 0.6 degrees as the frequency changes from 59 GHz to 66 GHz. As shown in FIG. 4B, further, the loss ranges between −11 decibel and −12 decibel in the frequency range of 59 GHz to 66 GHz.

Figure 5A:
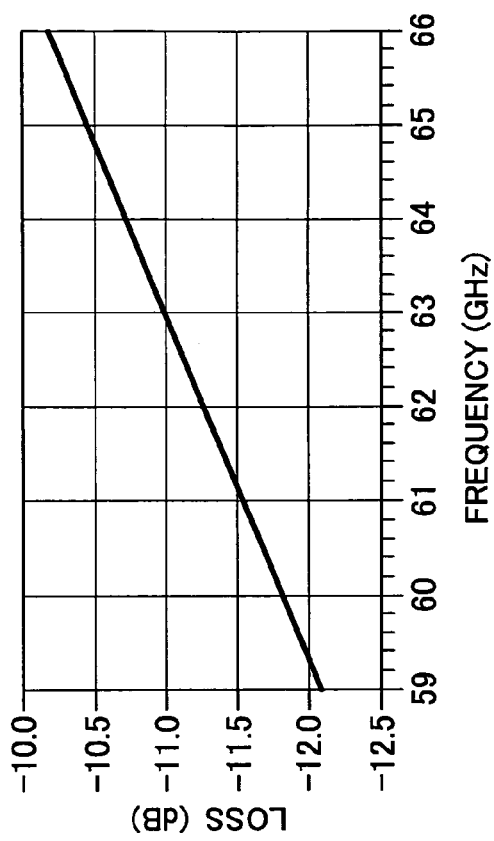
FIGS. 5A and 5B are drawings showing an example of the operation characteristics of the +45 degree phase shifter.
Figure 5B:
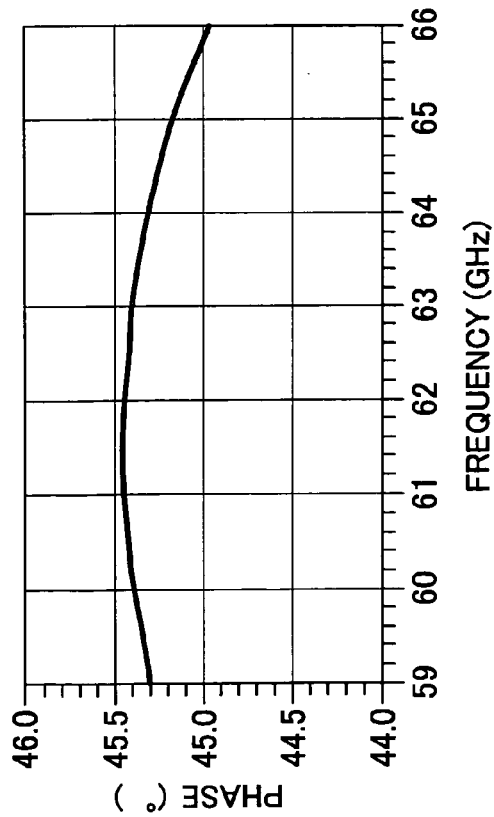

FIGS. 5A and 5B are drawings showing an example of the operation characteristics of the +45 degree phase shifter 22. FIG. 5A shows frequency along the horizontal axis and phase along the vertical axis, and illustrates phase deviation responsive to changes in frequency. FIG. 5B shows frequency along the horizontal axis and loss (decibel) along the vertical axis, and illustrates changes in loss responsive to changes in frequency. In the +45 degree phase shifter 22 shown in FIGS. 5A and 5B, the capacitance $C_{1n}$ of the capacitors 61 through 63 is 70 fF, the resistance $R_{1n}$ of the resistors 71 through 73 being 90 Ω, the characteristic impedance Z0 of the transmission line 81 being 50 Ω, the line length $L_{1n}$ of the transmission line 81 being 700 μm, the capacitance $C_{2n}$ of the capacitors 64 through 66 being 65 fF, the resistance $R_{2n}$ of the resistors 74 through 76 being 30 Ω, the characteristic impedance Z0 of the transmission line 82 being 50 Ω, and the line length $L_{2n}$ of the transmission line 82 being 400 μm.

With the parameter settings as specified above, the phase of the output of the +45 degree phase shifter 22 is maintained substantially at +45 degrees as shown in FIG. 5A, and exhibits a phase deviation as small as about 0.5 degrees as the frequency changes from 59 GHz to 66 GHz. As shown in FIG. 5B, further, the loss ranges between −10 decibel and −12 decibel in the frequency range of 59 GHz to 66 GHz.

As can be seen from comparison between the phase shown in FIG. 4A and the phase shown in FIG. 5A, the phase of the output signal of the −45 degree phase shifter 21 and the phase of the output signal of the +45 degree phase shifter 22 exhibit similar characteristics, such that these phases become maximum at the middle of the frequency range between 59 GHz and 66 GHz, with the lowering of phases towards the opposite ends thereof. Accordingly, when attention is focused on a 90-degree phase difference between these phase signals, such a phase difference exhibits little changes.

FIGS. 6A and 6B are drawings showing an example of the operation characteristics of a polyphase filter for the purpose of comparison with the present invention. FIG. 6A shows frequency along the horizontal axis and phase along the vertical axis, and illustrates phase deviation responsive to changes in frequency. FIG. 6B shows frequency along the horizontal axis and loss (decibel) along the vertical axis, and illustrates changes in loss responsive to changes in frequency. The polyphase filter whose operation characteristics are shown in FIGS. 6A and 6B has a circuit configuration as shown in FIGS. 1A and 1B.

As can be seen from FIG. 6A, the output of the polyphase filter exhibits a phase deviation greater than 20 degrees (close to 30 degrees) as the frequency changes from 59 GHz to 66 GHz. As shown in FIG. 6B, further, the loss ranges between −20 decibels and −25 decibels in the frequency range of 59 GHz to 66 GHz. Namely, the 90-degree phase shifter of the present invention whose characteristics are shown in FIGS. 4A and 4B and FIGS. 5A and 5B has a far smaller phase deviation and smaller signal loss over a broad range of frequencies than does the polyphase filter.

Figure 2:
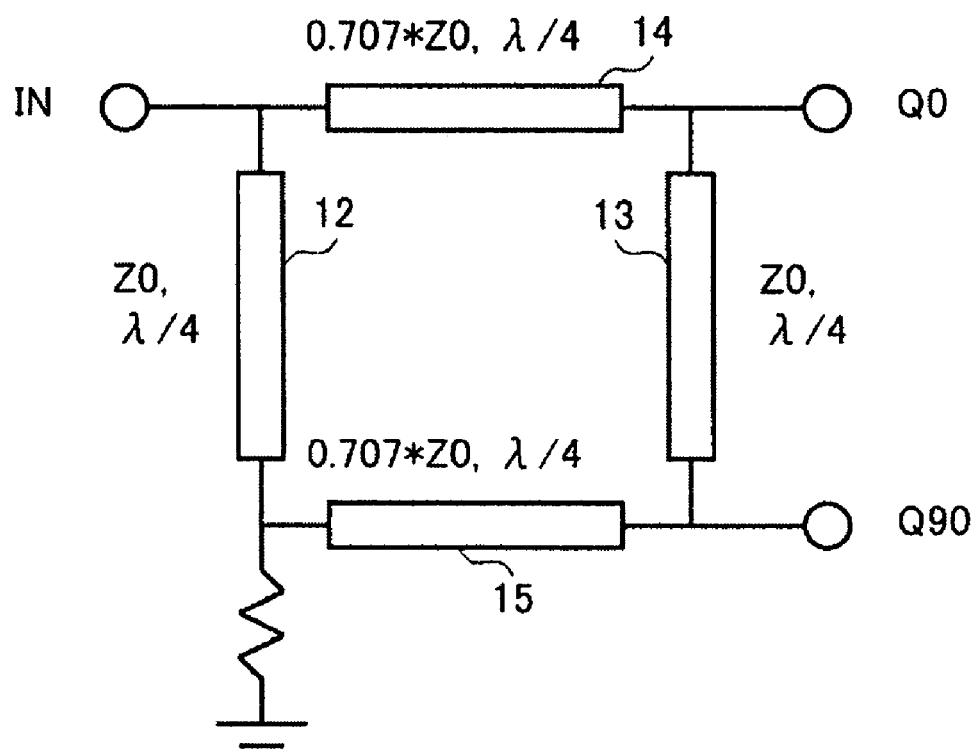
FIG. 2 is a drawing showing a typical configuration of a hybrid coupler.

FIGS. 7A and 7B are drawings showing an example of the operation characteristics of a hybrid coupler for the purpose of comparison with the present invention. FIG. 7A shows frequency along the horizontal axis and phase along the vertical axis, and illustrates phase deviation responsive to changes in frequency. FIG. 7B shows frequency along the horizontal axis and loss (decibel) along the vertical axis, and illustrates changes in loss responsive to changes in frequency. The hybrid coupler whose operation characteristics are shown in FIGS. 7A and 7B has a circuit configuration as shown in FIG. 2.

As can be seen from FIG. 7A, the output of the hybrid coupler exhibits a phase deviation greater than 20 degrees (close to 30 degrees) as the frequency changes from 59 GHz to 66 GHz. As shown in FIG. 7B, further, the loss ranges between 0 decibel and −5 decibels in the frequency range of 59 GHz to 66 GHz. Namely, the 90-degree phase shifter of the present invention whose characteristics are shown in FIGS. 4A and 4B and FIGS. 5A and 5B has a far smaller phase deviation over a broad range of frequencies than does the hybrid coupler.

Figure 8:
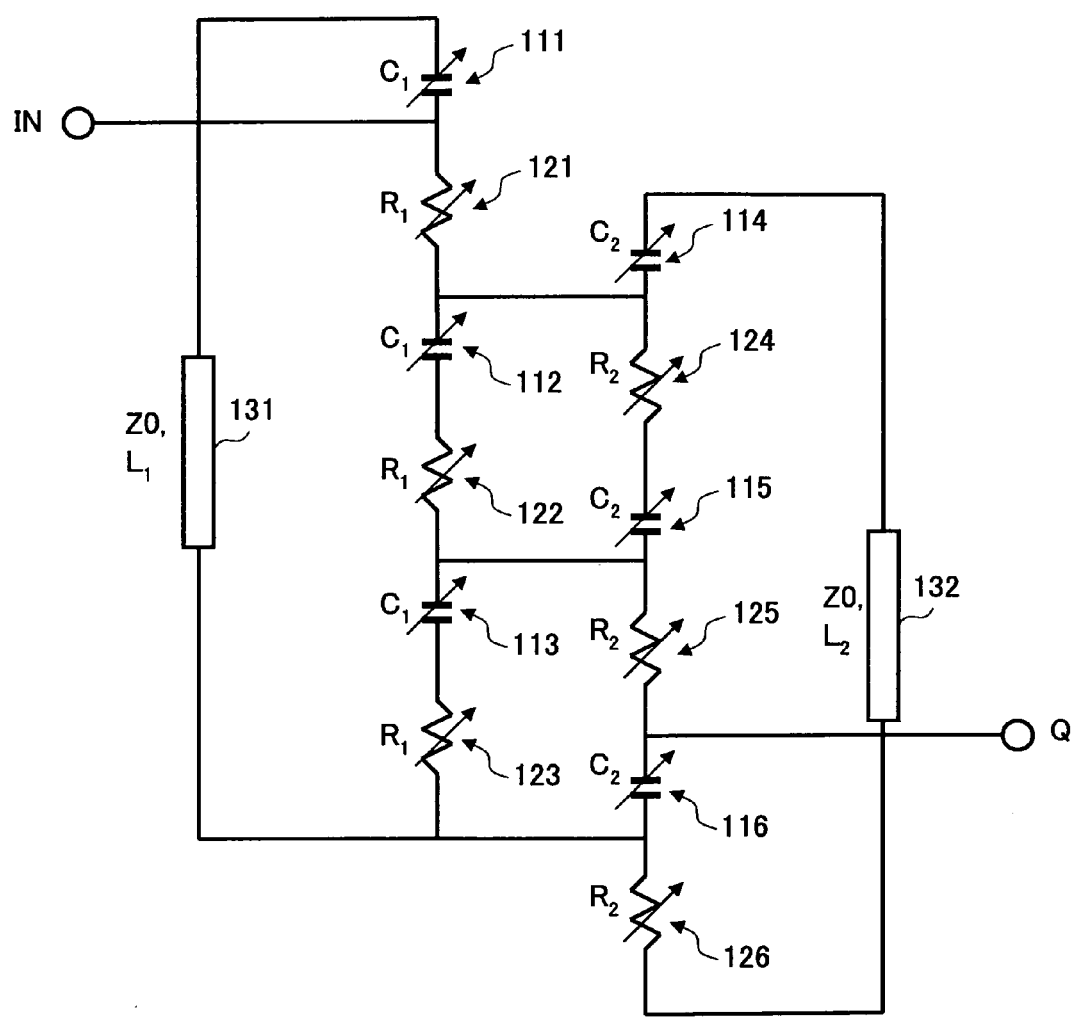
FIG. 8 is a drawing showing a variation of the phase shifter according to the present invention.

FIG. 8 is a drawing showing a variation of the phase shifter according to the present invention. In the case of the −45 degree phase shifter 21 and the +45 degree phase shifter 22 shown in FIGS. 3A and 3B, respectively, the values of the capacitors and resistors are fixed. IN the case of a variable phase shifter 23 shown in FIG. 8, the values of the capacitors and resistors are adjustable by use of variable capacitors and variable resistors.

The variable phase shifter 23 shown in FIG. 8 includes variable capacitors 111 through 116, variable resistors 121 through 126, and transmission lines 131 and 132. In this example, both the capacitances and the resistances are made adjustable. Alternatively, only one of the capacitances and the resistances may be made adjustable.

In the first loop circuit, the capacitors 111 through 113 have the same capacitance $C_1$, and the resistors 121 through 123 have the same resistance $R_1$. In the second loop circuit, the capacitors 114 through 116 have the same capacitance $C_2$, and the resistors 124 through 126 have the same resistance $R_2$. The transmission line 131 has a characteristic impedance Z0 and a line length $L_1$, and the transmission line 132 has a characteristic impedance Z0 and a line length $L_2$. The capacitance $C_1$ and the capacitance $C_2$ are different from each other, and the resistance $R_1$ and the resistance $R_2$ are different from each other. Further, the line length $L_1$ and the line length $L_2$ are different from each other. The characteristic impedance are the same between the transmission lines 131 and 132.

The adjustment of capacitances and resistances by use of the variable capacitors and the variable resistors makes it possible to control the amount of phase deviation. Namely, a −45 degree phase shifter may be implemented by use of the variable phase shifter 23, or a +45 degree phase shifter may be implemented by use of the variable phase shifter 23.

Figure 9A:
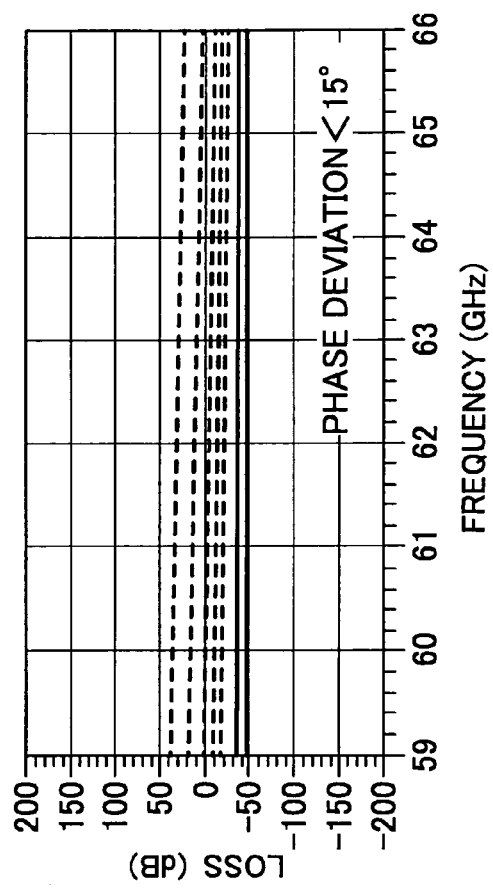
FIGS. 9A and 9B are drawings showing the comparison of operations between the variable phase shifter according to the present invention and a variable phase shifter using the related-art polyphase filter.
Figure 9B:
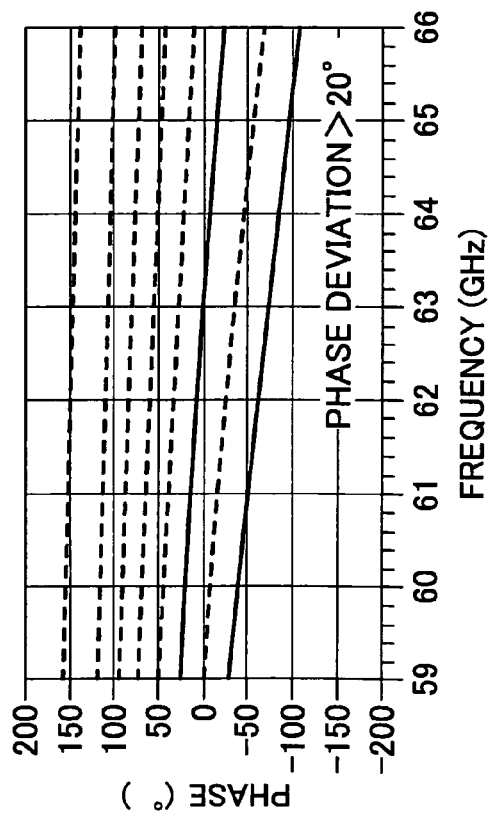

FIGS. 9A and 9B are drawings showing the comparison of operations between the variable phase shifter according to the present invention and a variable phase shifter using the related-art polyphase filter. FIG. 9A shows changes in an output Q270 when the value of capacitance is changed in the polyphase filter shown in FIGS. 1A and 1B in which variable capacitors are used as capacitor devices. FIG. 9B shows changes in the output signal of the variable phase shifter 23 shown in FIG. 8 in which the values of the capacitances are changed. FIGS. 9A and 9B show frequency along the horizontal axis and phase along the vertical axis, and illustrate phase deviation responsive to changes in frequency.

In the case of the variable polyphase filter shown in FIG. 9A, phase deviation is relatively large in the frequency range of 59 GHz to 66 GHz, and a phase deviation of 20 degrees at minimum is observed. In the case of the variable phase shifter 23 of the present invention shown in FIG. 9B, on the other hand, phase deviation is relatively small in the frequency range of 59 GHz to 66 GHz, and a phase deviation of 15 degrees at the maximum is observed.

In the following, variations of the −45 degree phase shifter 21 according to the present invention will be described. These variations are also applicable to the +45 degree phase shifter 22.

Figure 10:
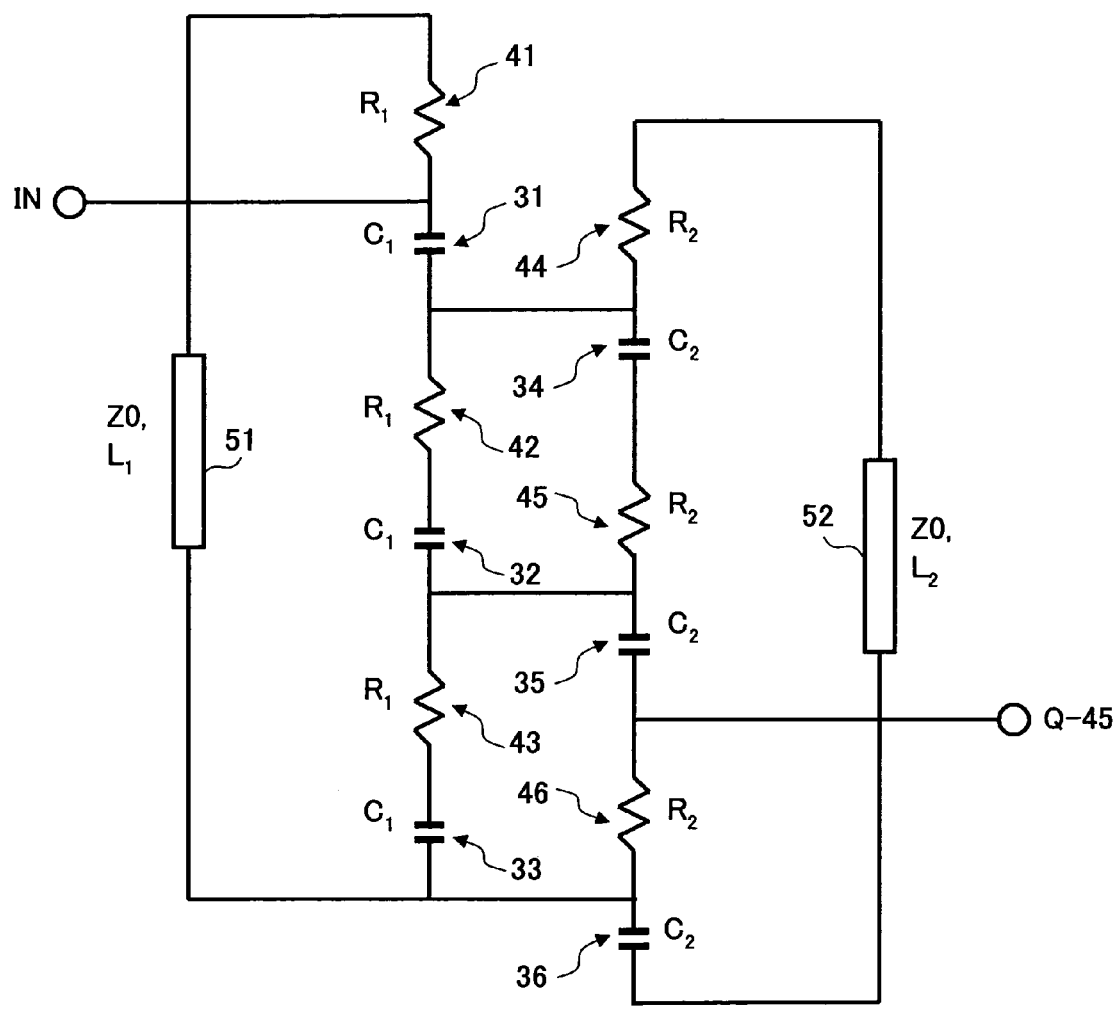
FIG. 10 is a drawing showing a first variation of the −45 degree phase shifter according to the present invention.

FIG. 10 is a drawing showing a first variation of the −45 degree phase shifter according to the present invention. In FIG. 10, the same elements as those of FIG. 3A are referred to by the same numerals, and a description thereof will be omitted.

A −45 degree phase shifter 21A shown in FIG. 10 includes capacitors 31 through 36, resistors 41 through 46, and transmission lines 51 and 52. In the −45 degree phase shifter 21A, compared with the configuration shown in FIG. 3A, the positions of capacitors and the positions of resistors are swapped in the first loop circuit, and the positions of capacitors and the positions of resistors are swapped in the second loop circuit. Except for the swapping of the positions of capacitors and the positions of resistors, this configuration is the same as that of the −45 degree phase shifter 21 shown in FIG. 3A.

In the first loop circuit, the capacitors 31 through 33 have the same capacitance $C_1$, and the resistors 41 through 43 have the same resistance $R_1$. In the second loop circuit, the capacitors 34 through 36 have the same capacitance $C_2$, and the resistors 44 through 46 have the same resistance $R_2$. The transmission line 51 has a characteristic impedance Z0 and a line length $L_1$, and the transmission line 52 has a characteristic impedance Z0 and a line length $L_2$. The capacitance $C_1$ and the capacitance $C_2$ are different from each other, and the resistance $R_1$ and the resistance $R_2$ are different from each other. Further, the line length $L_1$ and the line length $L_2$ are different from each other. The characteristic impedance are the same between the transmission lines 51 and 52.

Figure 11A:
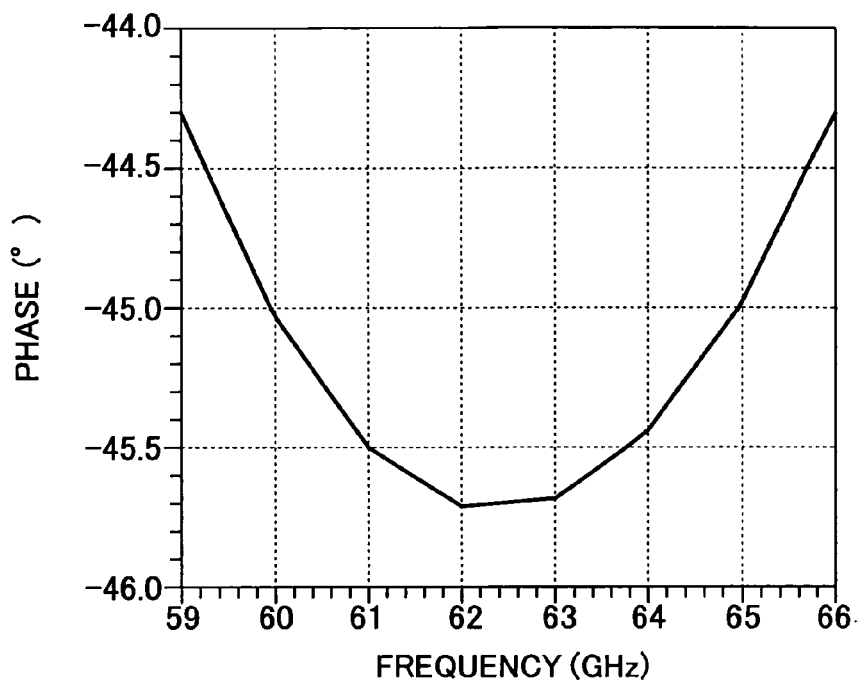
FIGS. 11A and 11B are drawings showing an example of the operation characteristics of the −45 degree phase shifter of FIG. 10.
Figure 11B:
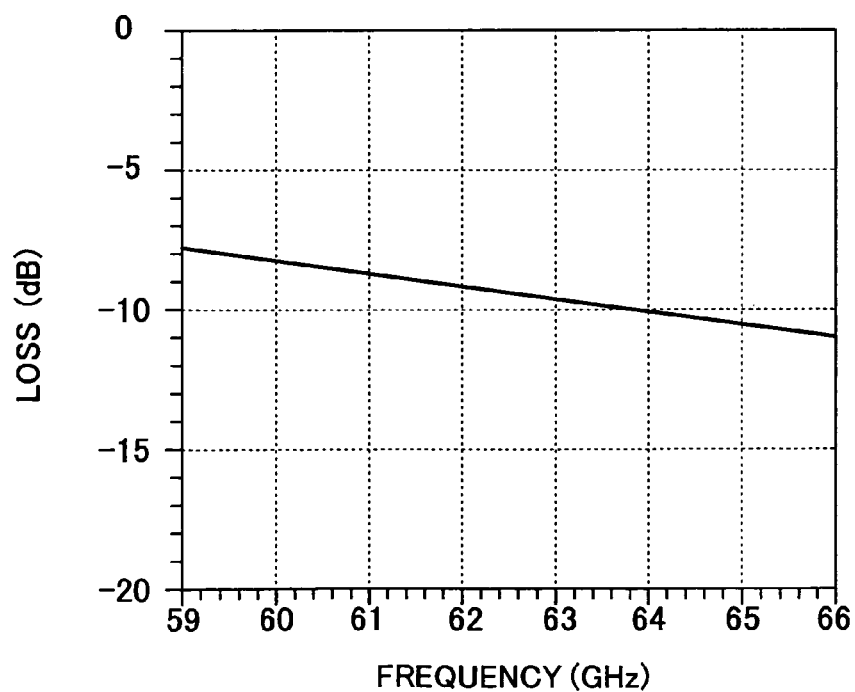

FIGS. 11A and 11B are drawings showing an example of the operation characteristics of the −45 degree phase shifter 21A. FIG. 11A shows frequency along the horizontal axis and phase along the vertical axis, and illustrates phase deviation responsive to changes in frequency. FIG. 11B shows frequency along the horizontal axis and loss (decibel) along the vertical axis, and illustrates changes in loss responsive to changes in frequency. In the −45 degree phase shifter 21A whose operation characteristics are shown in FIGS. 11A and 11B, the capacitance $C_1$ of the capacitors 31 through 33 is 4 pF, the resistance $R_1$ of the resistors 41 through 43 being 25 Ω, the characteristic impedance Z0 of the transmission line 51 being 50 Ω, the line length $L_1$ of the transmission line 51 being 120 µm, the capacitance $C_2$ of the capacitors 34 through 36 being 4 pF, the resistance $R_2$ of the resistors 44 through 46 being 1000 Ω, the characteristic impedance Z0 of the transmission line 52 being 50 Ω, and the line length $L_2$ of the transmission line 52 being 360 µm.

With the parameter settings as specified above, the phase of the output of the −45 degree phase shifter 21A is maintained substantially at −45 degrees as shown in FIG. 11A, and exhibits a phase deviation as small as about 1.4 degrees as the frequency changes from 59 GHz to 66 GHz. As shown in FIG. 11B, further, the loss ranges between −8 decibels and −11 decibels in the frequency range of 59 GHz to 66 GHz.

Figure 12:
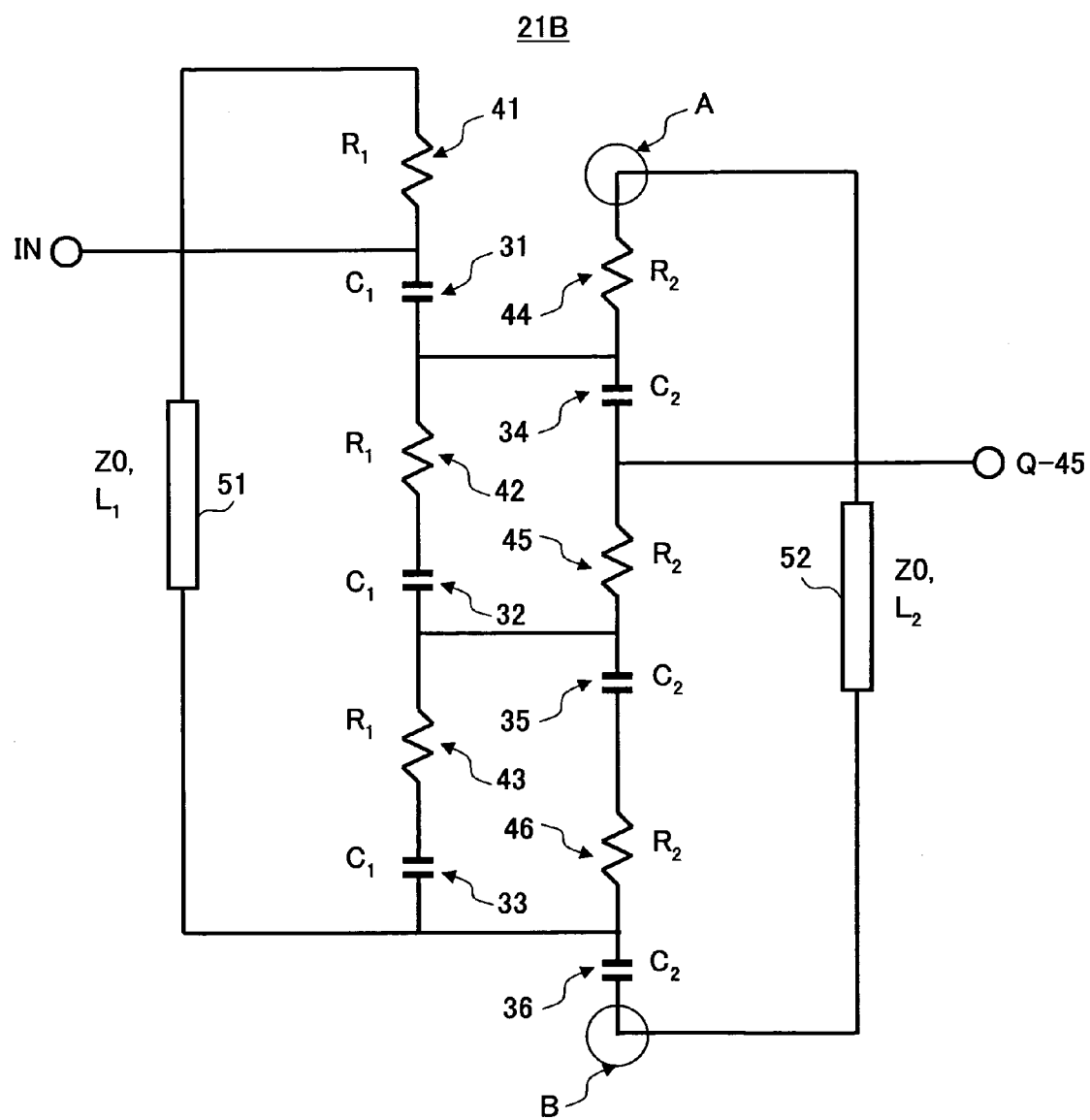
FIG. 12 is a drawing showing a second variation of the −45 degree phase shifter according to the present invention.

FIG. 12 is a drawing showing a second variation of the −45 degree phase shifter according to the present invention. In FIG. 12, the same elements as those of FIG. 10 are referred to by the same numerals, and a description thereof will be omitted.

A −45 degree phase shifter 21B shown in FIG. 12 includes capacitors 31 through 36, resistors 41 through 46, and transmission lines 51 and 52. In the −45 degree phase shifter 21B, compared with the −45 degree phase shifter 21A shown in FIG. 10, the position of the output terminal Q−45 is moved. Except for the change in the position of the output terminal Q−45, this configuration is the same as that of the −45 degree phase shifter 21A shown in FIG. 10.

Figure 13A:
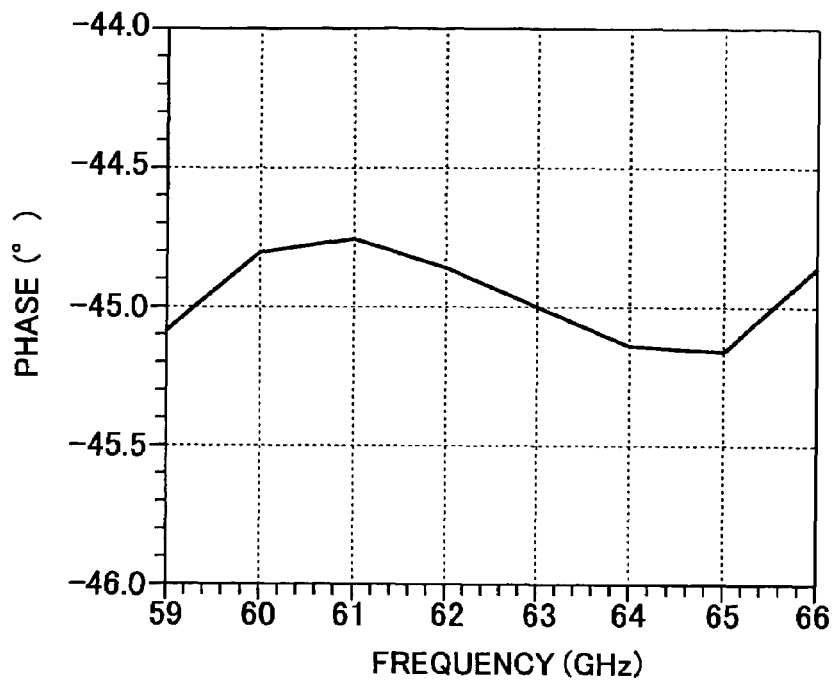
FIGS. 13A and 13B are drawings showing an example of the operation characteristics of the −45 degree phase shifter of FIG. 12.
Figure 13B:
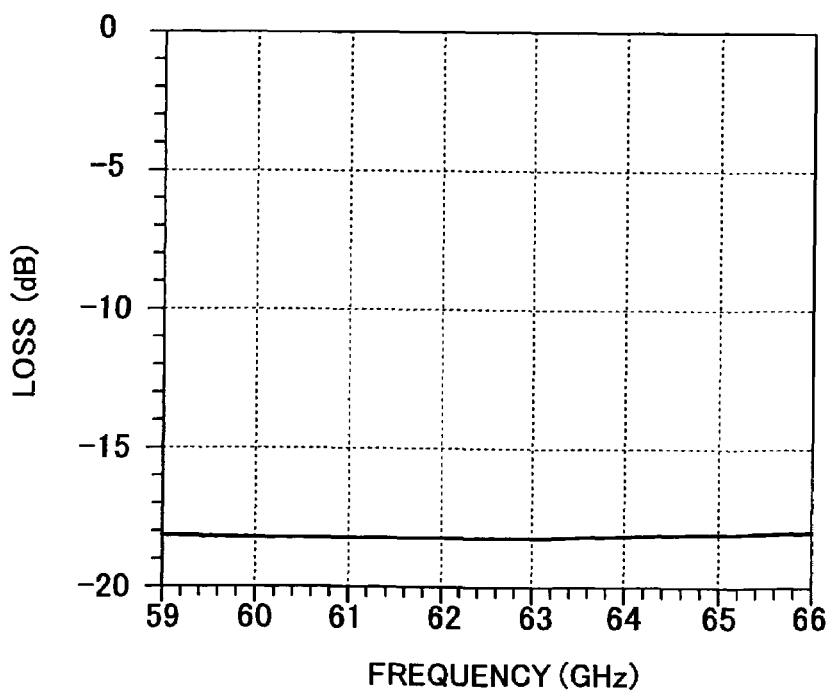

FIGS. 13A and 13B are drawings showing an example of the operation characteristics of the −45 degree phase shifter 21B. FIG. 13A shows frequency along the horizontal axis and phase along the vertical axis, and illustrates phase deviation responsive to changes in frequency. FIG. 13B shows frequency along the horizontal axis and loss (decibel) along the vertical axis, and illustrates changes in loss responsive to changes in frequency. In the −45 degree phase shifter 21B whose operation characteristics are shown in FIGS. 13A and 13B, the capacitance $C_1$ of the capacitors 31 through 33 is 0.15 pF, the resistance $R_1$ of the resistors 41 through 43 being 720 Ω, the characteristic impedance Z0 of the transmission line 51 being 50 Ω, the line length $L_1$ of the transmission line 51 being 60 μm, the capacitance $C_2$ of the capacitors 34 through 36 being 0.12 pF, the resistance $R_2$ of the resistors 44 through 46 being 1950 Ω, the characteristic impedance Z0 of the transmission line 52 being 50 Ω, and the line length $L_2$ of the transmission line 52 being 820 μm.

With the parameter settings as specified above, the phase of the output of the −45 degree phase shifter 21B is maintained substantially at −45 degrees as shown in FIG. 13A, and exhibits a phase deviation as small as about 0.5 degrees as the frequency changes from 59 GHz to 66 GHz. As shown in FIG. 13B, further, the loss is about −18 decibels in the frequency range of 59 GHz to 66 GHz.

The position of the output terminal may be moved as described above. It should be noted, however, that the position of the output terminal is preferably at a connection point between two adjacent series circuits (wherein one series circuit is comprised of a series connection of one resistor and one capacitor) included in the second loop circuit. If the output terminal Q−45 is positioned at a point A or point B shown in FIG. 12, which is a connection point between a series circuit and the transmission line 52, and is different from a connection point between two adjacent series circuits, the signal loss is undesirably too large.

Figure 14:
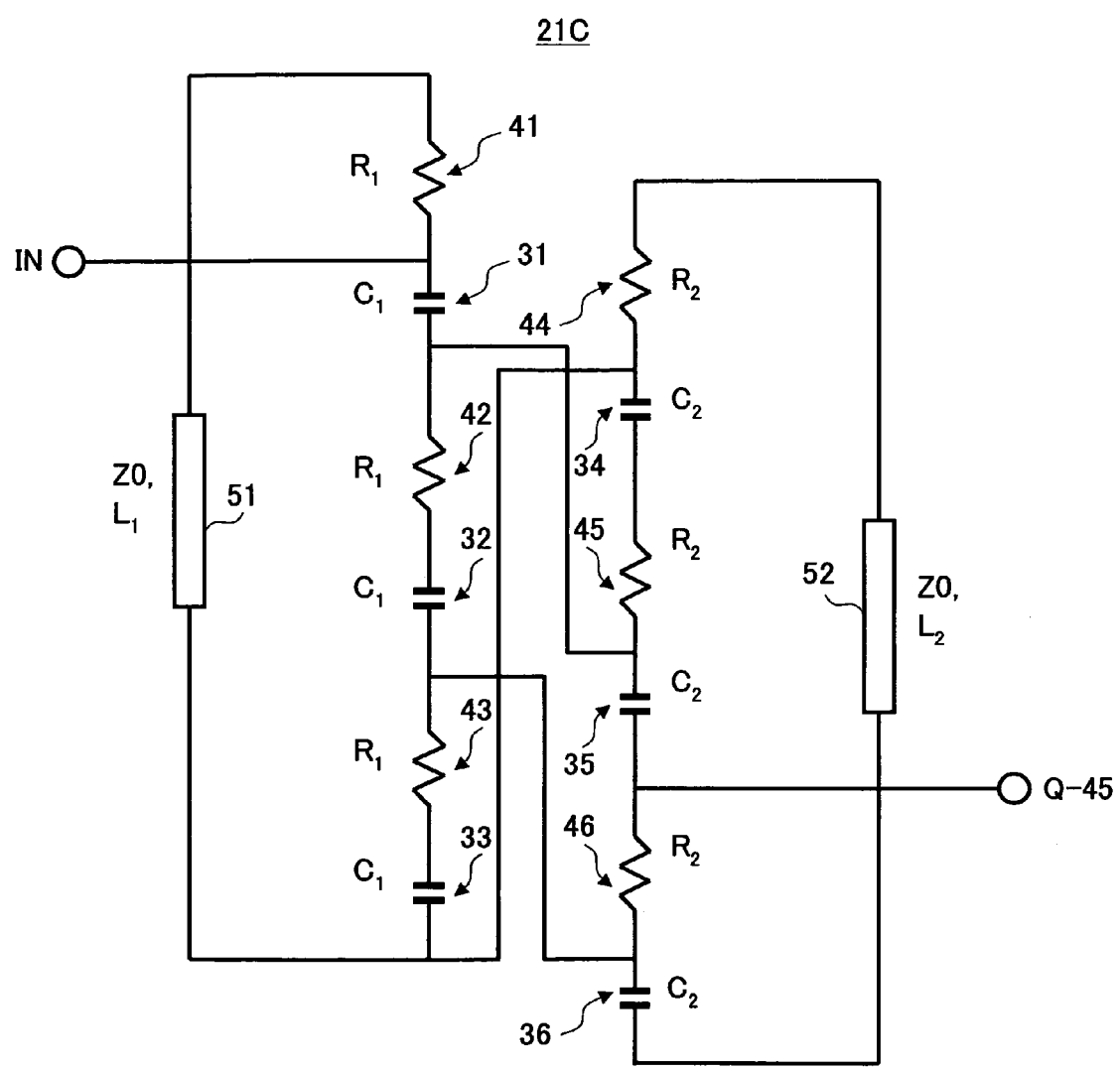
FIG. 14 is a drawing showing a third variation of the −45 degree phase shifter according to the present invention.

FIG. 14 is a drawing showing a third variation of the −45 degree phase shifter according to the present invention. In FIG. 14, the same elements as those of FIG. 10 are referred to by the same numerals, and a description thereof will be omitted.

A −45 degree phase shifter 21C shown in FIG. 14 includes capacitors 31 through 36, resistors 41 through 46, and transmission lines 51 and 52. In the −45 degree phase shifter 21C, compared with the −45 degree phase shifter 21A shown in FIG. 10, the connections between the first loop circuit and the second loop circuit are changed. Except for the change in connections between the first loop circuit and the second loop circuit, this configuration is the same as that of the −45 degree phase shifter 21A shown in FIG. 10.

Figure 15A:
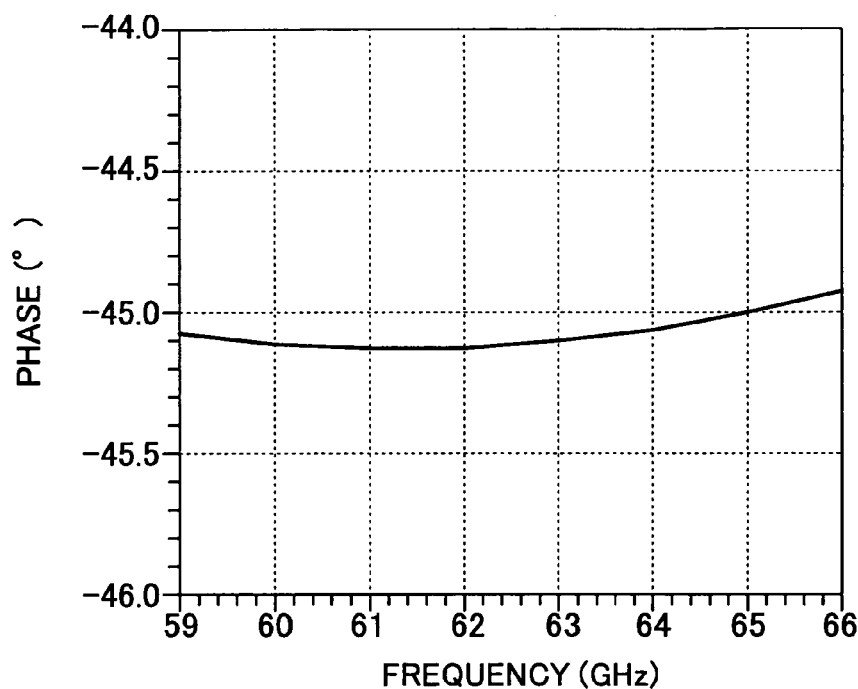
FIGS. 15A and 15B are drawings showing an example of the operation characteristics of the −45 degree phase shifter of FIG. 14.
Figure 15B:
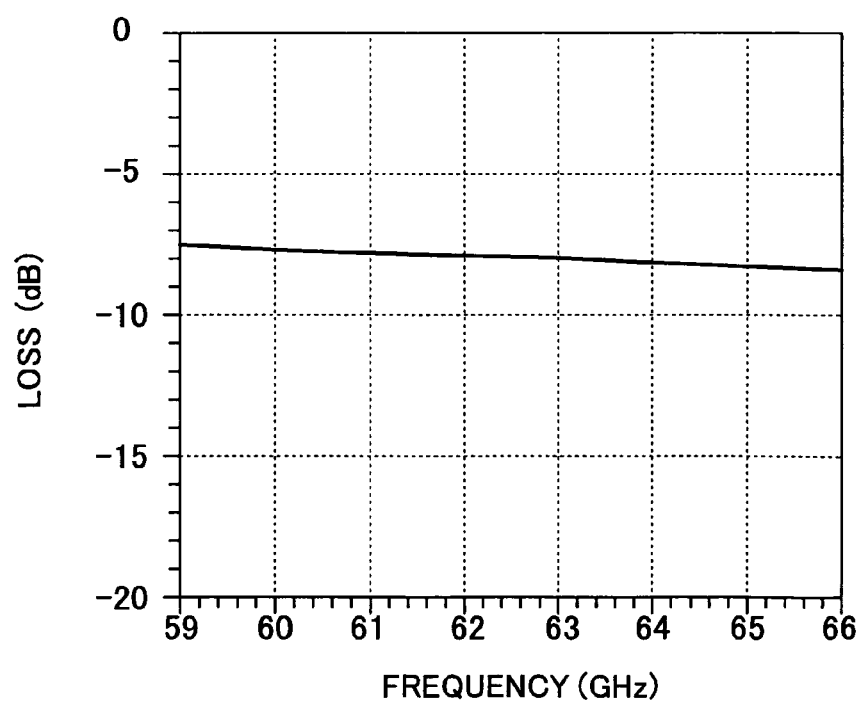

FIGS. 15A and 15B are drawings showing an example of the operation characteristics of the −45 degree phase shifter 21C. FIG. 15A shows frequency along the horizontal axis and phase along the vertical axis, and illustrates phase deviation responsive to changes in frequency. FIG. 15B shows frequency along the horizontal axis and loss (decibel) along the vertical axis, and illustrates changes in loss responsive to changes in frequency. In the −45 degree phase shifter 21C whose operation characteristics are shown in FIGS. 15A and 15B, the capacitance $C_1$ of the capacitors 31 through 33 is 0.25 pF, the resistance $R_1$ of the resistors 41 through 43 being 10 Ω, the characteristic impedance Z0 of the transmission line 51 being 50 Ω, the line length $L_1$ of the transmission line 51 being 70 μm, the capacitance $C_2$ of the capacitors 34 through 36 being 0.87 pF, the resistance $R_2$ of the resistors 44 through 46 being 100 Ω, the characteristic impedance Z0 of the transmission line 52 being 50 Ω, and the line length $L_2$ of the transmission line 52 being 75 μm.

With the parameter settings as specified above, the phase of the output of the −45 degree phase shifter 21C is maintained substantially at −45 degrees as shown in FIG. 13A, and exhibits a phase deviation as small as about 0.2 degrees as the frequency changes from 59 GHz to 66 GHz. As shown in FIG. 15B, further, the loss is about −8 decibels in the frequency range of 59 GHz to 66 GHz.

When the first loop circuit is connected to the second loop circuit, as previously described, each of the three series circuits included in the first loop circuit has one end thereof on the same side serving as a connection point to the second loop circuit, and each of the three series circuits included in the second loop circuit has a connection point between the capacitor and the resistor thereof serving as a connection point to the first loop circuit. The connection points of the first loop circuit are then connected in one-to-one correspondence to the connection points of the second loop circuits according to the order of their spatial arrangement.

In so doing, connections between the one ends of the first through third series circuits included in the first loop circuit and the internal connection points of the first through third series circuits included in the second loop circuit are required to keep the order of the first, the second, and the third while allowing a cyclic shift. Namely, as shown in FIG. 10, the first, second, and third series circuits provided in the first loop circuit may be connected to the first, second, and third series circuits provided in the second loop circuit, respectively, or, as shown in FIG. 14, the first, second, and third series circuits provided in the first loop circuit may be connected to the second, third, and first series circuits provided in the second loop circuit, respectively.

Figure 16:
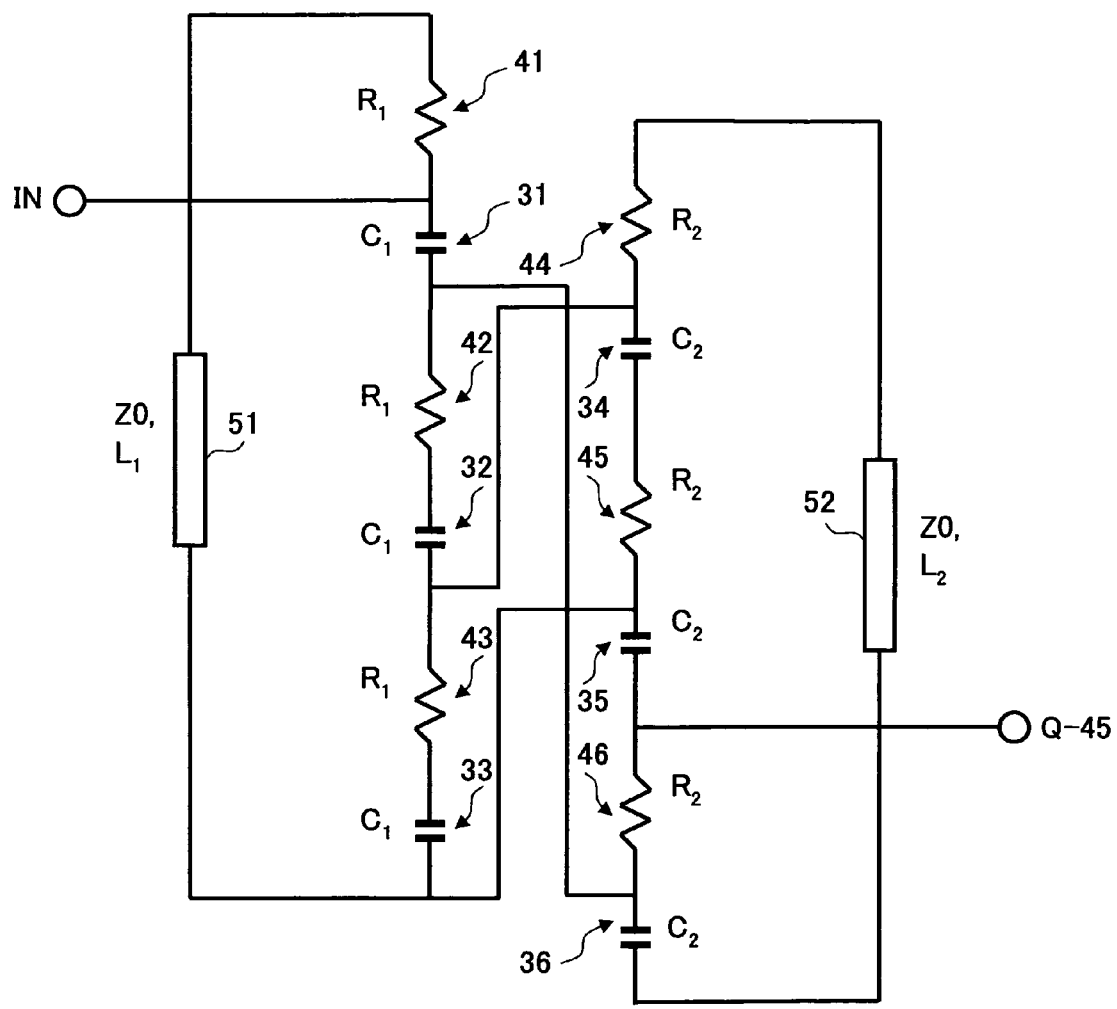
FIG. 16 is a drawing showing a fourth variation of the −45 degree phase shifter.

By the same token, the first, second, and third series circuits provided in the first loop circuit may be connected to the third, first, and second series circuits provided in the second loop circuit, respectively. FIG. 16 is a drawing showing a fourth variation of the −45 degree phase shifter. In a −45 degree phase shifter 21D shown in FIG. 16, the first, second, and third series circuits provided in the first loop circuit are connected to the third, first, and second series circuits provided in the second loop circuit, respectively.

Figure 17:
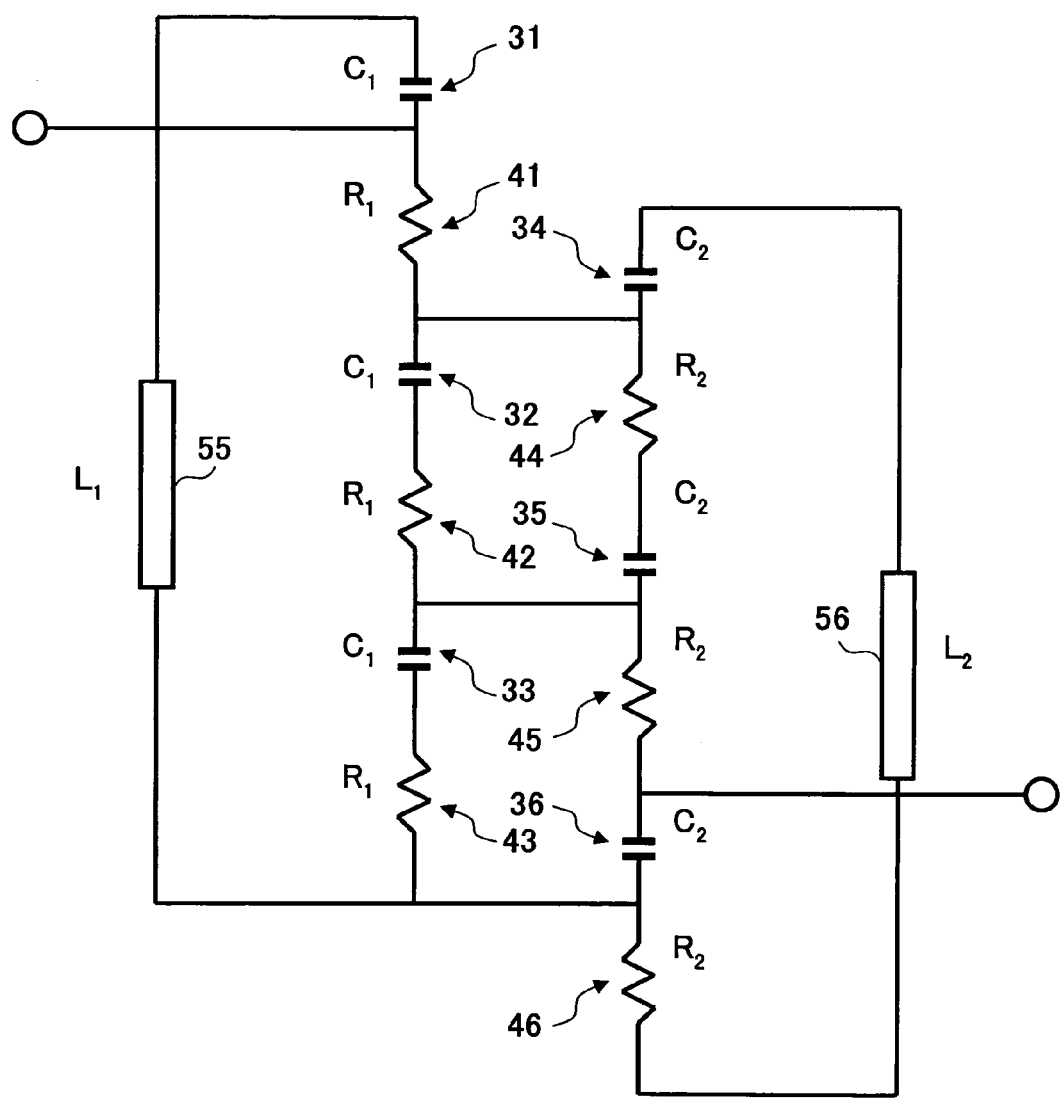
FIG. 17 is a drawing showing a fifth variation of the −45 degree phase shifter according to the present invention.

FIG. 17 is a drawing showing a fifth variation of the −45 degree phase shifter according to the present invention. In FIG. 17, the same elements as those of FIG. 3A are referred to by the same numerals, and a description thereof will be omitted.

A −45 degree phase shifter 21E shown in FIG. 17 includes capacitors 31 through 36, resistors 41 through 46, and inductors 55 and 56. In the −45 degree phase shifter 21E, compared with the configuration shown in FIG. 3A, the inductors 55 and 56 are provided in place of the transmission lines 51 and 52. Except for the provision of the inductors 55 and 56 in place of the transmission lines 51 and 52, this configuration is the same as that of the −45 degree phase shifter 21 shown in FIG. 3A.

In the first loop circuit, the capacitors 31 through 33 have the same capacitance $C_1$, and the resistors 41 through 43 have the same resistance $R_1$. In the second loop circuit, the capacitors 34 through 36 have the same capacitance $C_2$, and the resistors 44 through 46 have the same resistance $R_2$. The inductors 55 and 56 have inductances $L_1$ and $L_2$, respectively. The capacitance $C_1$ and the capacitance $C_2$ are different from each other, and the resistance $R_1$ and the resistance $R_2$ are different from each other. Further, the inductance $L_1$ and the inductance $L_2$ are different from each other.

Figure 18A:
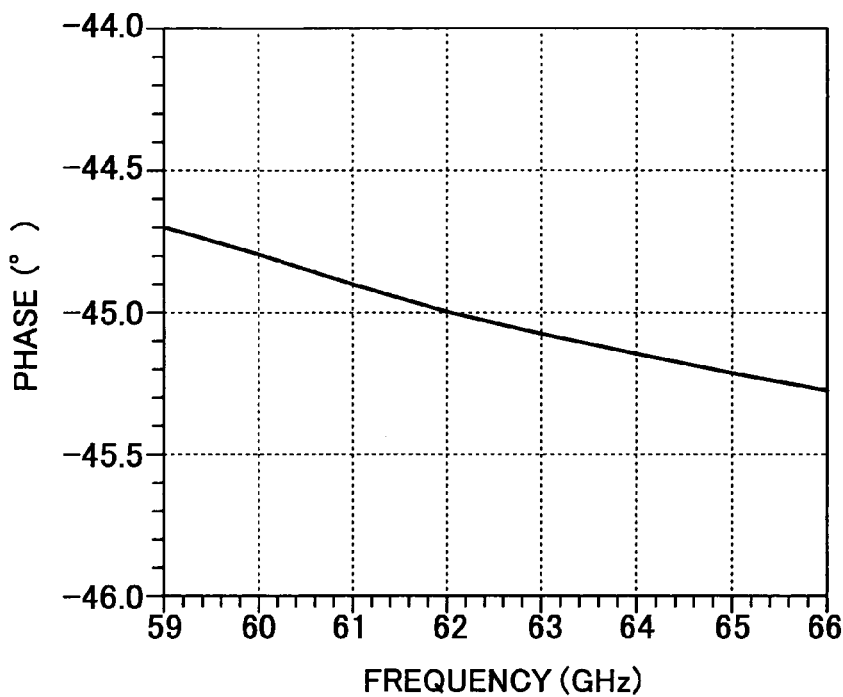
FIGS. 18A and 18B are drawings showing an example of the operation characteristics of the −45 degree phase shifter of FIG. 17.
Figure 18B:
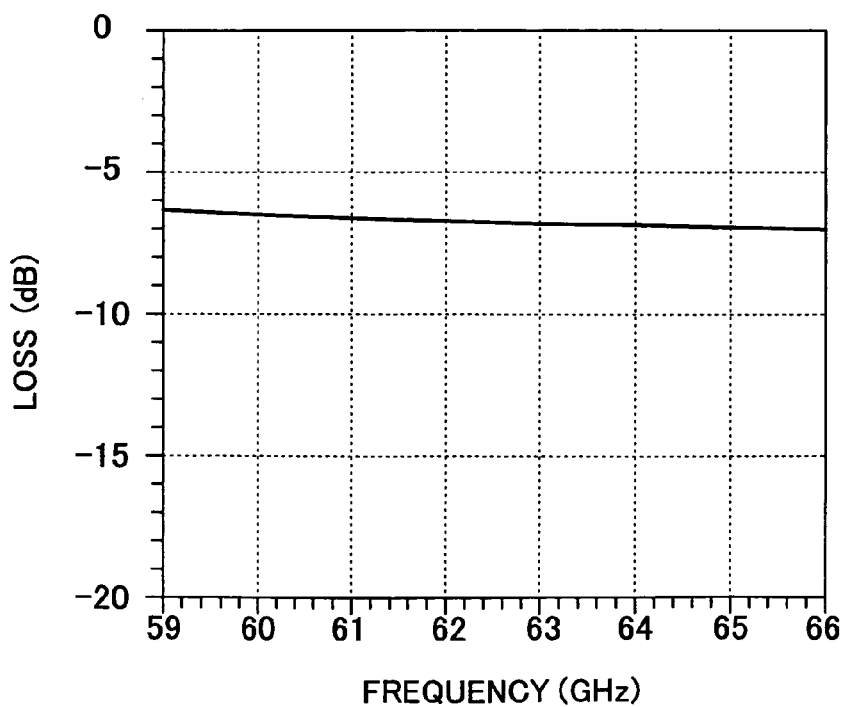

FIGS. 18A and 18B are drawings showing an example of the operation characteristics of the −45 degree phase shifter 21E. FIG. 18A shows frequency along the horizontal axis and phase along the vertical axis, and illustrates phase deviation responsive to changes in frequency. FIG. 18B shows frequency along the horizontal axis and loss (decibel) along the vertical axis, and illustrates changes in loss responsive to changes in frequency. In the −45 degree phase shifter 21E whose operation characteristics are shown in FIGS. 18A and 18B, the capacitance $C_1$ of the capacitors 31 through 33 is 3.3 pF, the resistance $R_1$ of the resistors 41 through 43 being 215 Ω, the inductance $L_1$ of the inductor 55 being 0.45 nH, the capacitance $C_2$ of the capacitors 34 through 36 being 1.9 pF, the resistance $R_2$ of the resistors 44 through 46 being 1250 Ω, and the inductance $L_2$ of the inductor 56 being 0.76 nH.

With the parameter settings as specified above, the phase of the output of the −45 degree phase shifter 21E is maintained substantially at −45 degrees as shown in FIG. 18A, and exhibits a phase deviation as small as about 0.6 degrees as the frequency changes from 59 GHz to 66 GHz. As shown in FIG. 18B, further, the loss ranges between −6 decibels and −7 decibels in the frequency range of 59 GHz to 66 GHz.

In the phase shifter of the present invention as described above, the advantage that a phase deviation is kept small over a broad range of frequencies is achieved even if inductors are used in place of transmission lines.

In this manner, the phase shifter of the present invention may be modified in various fashions while maintaining the advantage that a small phase deviation is achieved over a broad range of frequencies, and is not limited to the particular configurations described in the above embodiments. It should be noted that the values of circuit parameters suitable to the individual circuit configurations as shown in the various embodiments and variations described above are not uniquely determined through a calculation method that is mathematically proven. The values of circuit parameters suitable to a phase shifter of the present invention may properly be determined through numerical computation based on the numerical analysis of the circuit conducted by use of a computer.

Further, the present invention is not limited to these embodiments, but various variations and modifications may be made without departing from the scope of the present invention.

What is claimed is:

1. A phase shifter circuit, comprising:
   a plurality of first series circuits each comprised of a series connection of one capacitor and one resistor;
   a first circuit element including at least inductance connecting between a first end and a second end of a chain structure made by connecting the plurality of first series circuits in series such that capacitors and resistors alternate with each other, the first circuit element and the chain structure together constituting a first loop circuit;
   a plurality of second series circuits each comprised of a series connection of one capacitor and one resistor;
   a second circuit element including at least inductance connecting between a first end and a second end of a chain structure made by connecting the plurality of second series circuits in series such that capacitors and resistors alternate with each other, the second circuit element and the chain structure together constituting a second loop circuit;
   a plurality of connection lines connecting between connection points of the first loop circuit and connection points of the second loop circuit, two adjacent ones of the connection points of the first loop circuit being two end points of a series connected resistor and capacitor of one of the first series circuits;
   a signal input terminal connected to a node in the first loop circuit; and
   a signal output terminal connected to a node in the second loop circuit.

2. The phase shifter circuit as claimed in claim 1, further comprising:
   a plurality of third series circuits each comprised of a series connection of one capacitor and one resistor;
   a third circuit element including at least inductance connecting between a first end and a second end of a chain structure made by connecting the plurality of third series circuits in series, the third circuit element and the chain structure together constituting a third loop circuit;
   a plurality of fourth series circuits each comprised of a series connection of one capacitor and one resistor;
   a fourth circuit element including at least inductance connecting between a first end and a second end of a chain structure made by connecting the plurality of fourth series circuits in series, the fourth circuit element and the chain structure together constituting a fourth loop circuit;
   a plurality of connection lines connecting between the third loop circuit and the fourth loop circuit;
   a signal input terminal connected to a node in the third loop circuit; and
   a signal output terminal connected to a node in the fourth loop circuit.

3. The phase shifter circuit as claimed in claim 1, wherein a number of the first series circuits included in the first loop circuit is three, and a number of the second series circuits included in the second loop circuit is three.

4. The phase shifter circuit as claimed in claim 1, wherein the first circuit element and the second circuit element are transmission lines.

5. A phase shifter circuit, comprising:
   a plurality of first series circuits each comprised of a series connection of one capacitor and one resistor;
   a first circuit element including at least inductance connecting between a first end and a second end of a chain structure made by connecting the plurality of first series circuits in series such that capacitors and resistors alternate with each other, the first circuit element and the chain structure together constituting a first loop circuit;
   a plurality of second series circuits each comprised of a series connection of one capacitor and one resistor;
   a second circuit element including at least inductance connecting between a first end and a second end of a chain structure made by connecting the plurality of second series circuits in series such that capacitors and resistors alternate with each other, the second circuit element and the chain structure together constituting a second loop circuit;
   a plurality of connection lines connecting between the first loop circuit and the second loop circuit;
   a signal input terminal connected to a node in the first loop circuit; and
   a signal output terminal connected to a node in the second loop circuit,
   wherein the first circuit element and the second circuit element are transmission lines,
   wherein the transmission line that is the first circuit element and the transmission line that is the second circuit element have an identical characteristic impedance and different line lengths.

6. The phase shifter circuit as claimed in claim 1, wherein the first circuit element and the second circuit element are inductors.

7. A phase shifter circuit, comprising:
   a plurality of first series circuits each comprised of a series connection of one capacitor and one resistor;
   a first circuit element including at least inductance connecting between a first end and a second end of a chain structure made by connecting the plurality of first series circuits in series such that capacitors and resistors alternate with each other, the first circuit element and the chain structure together constituting a first loop circuit;
   a plurality of second series circuits each comprised of a series connection of one capacitor and one resistor;

a second circuit element including at least inductance connecting between a first end and a second end of a chain structure made by connecting the plurality of second series circuits in series such that capacitors and resistors alternate with each other, the second circuit element and the chain structure together constituting a second loop circuit;

a plurality of connection lines connecting between the first loop circuit and the second loop circuit;

a signal input terminal connected to a node in the first loop circuit; and a signal output terminal connected to a node in the second loop circuit, wherein the first circuit element and the second circuit element are inductors, wherein the inductor that is the first circuit element and the inductor that is the second circuit element have different inductances.

8. A phase shifter circuit, comprising:

a plurality of first series circuits each comprised of a series connection of one capacitor and one resistor;

a first circuit element including at least inductance connecting between a first end and a second end of a chain structure made by connecting the plurality of first series circuits in series such that capacitors and resistors alternate with each other, the first circuit element and the chain structure together constituting a first loop circuit;

a plurality of second series circuits each comprised of a series connection of one capacitor and one resistor;

a second circuit element including at least inductance connecting between a first end and a second end of a chain structure made by connecting the plurality of second series circuits in series such that capacitors and resistors alternate with each other, the second circuit element and the chain structure together constituting a second loop circuit;

a plurality of connection lines connecting between the first loop circuit and the second loop circuit;

a signal input terminal connected to a node in the first loop circuit; and a signal output terminal connected to a node in the second loop circuit, wherein the capacitor and resistor of each of the first series circuits have an identical capacitance and identical resistance in the first loop circuit, and the capacitor and resistor of each of the second series circuits have an identical capacitance and identical resistance in the second loop circuit, and wherein the capacitor and resistor of each of the first series circuits included in the first loop circuit have a different capacitance and different resistance than the capacitor and resistor of each of the second series circuits included in the second loop circuit.

9. The phase shifter circuit as claimed in claim 1, wherein the connection lines provide connections in one-to-one correspondence between one end on the same side of each of the first series circuits included in the first loop circuit and a connection point between the capacitor and resistance of each of the second series circuits included in the second loop circuit.

10. The phase shifter circuit as claimed in claim 1, wherein the signal input terminal is connected to a connection point between the capacitor and resistor of one of the first series circuits included in the first loop circuit, and the signal output terminal is connected to a connection point between two adjacent ones of the second series circuits included in the second loop circuit.

11. The phase shifter circuit as claimed in claim 1, wherein at least one of the capacitor and the resistor is configured to be variable.

12. The phase shifter circuit as claimed in claim 1, wherein the first circuit element is different from the first series circuits, and the second circuit element is different from the second series circuits.

13. The phase shifter circuit as claimed in claim 2, wherein the signal output terminal connected to a node in the second loop circuit and the signal output terminal connected to a node in the fourth loop circuit are configured to output signals having a 90-degree phase difference with each other.

14. The phase shifter circuit as claimed in claim 2, wherein capacitors and resistors alternate with each other in the third loop circuit, and capacitors and resistors alternate with each other in the fourth loop circuit.

* * * * *